United States Patent [19]

Ohmori et al.

[11] Patent Number: 4,986,216
[45] Date of Patent: Jan. 22, 1991

[54] SEMICONDUCTOR MANUFACTURING APPARATUS

[75] Inventors: Toshiaki Ohmori; Takaaki Fukumoto, both of Itami, Japan

[73] Assignee: Mitsubishi Denki Kabushiki Kaisha, Japan

[21] Appl. No.: 387,062

[22] Filed: Jul. 31, 1989

[30] Foreign Application Priority Data

May 10, 1989 [JP] Japan ................... 1-115160

[51] Int. Cl.⁵ .............................. C23C 16/00
[52] U.S. Cl. .................... 118/730; 118/715; 118/725; 156/345
[58] Field of Search ............... 118/715, 723, 725, 730; 156/345

[56] References Cited

FOREIGN PATENT DOCUMENTS 60-202937 10/1985 Japan ................... 156/345
61-208222 9/1986 Japan ................... 156/345

Primary Examiner—Richard Bueker
Attorney, Agent, or Firm—Leydig, Voit & Mayer

[57] ABSTRACT

A semiconductor manufacturing apparatus includes members for uniformly supplying a reactant gas into a chamber and uniformly discharging it from the chamber, and two rectifying members disposed on opposite sides of a substrate for making the flow rate and the direction of the reactant gas constant. This arrangement ensures that the surface of the substrate is processed with a high degree of accuracy.

19 Claims, 1 Drawing Sheet

SEMICONDUCTOR MANUFACTURING APPARATUS

BACKGROUND OF THE INVENTION

1. Field of the Invention

The present invention relates to a semiconductor manufacturing apparatus and, more particularly, the present invention concerns a semiconductor manufacturing apparatus for processing the surface of a semiconductor substrate using a reactant gas, the processing including etching and film formation.

2. Description of the Related Art

FIG. 1 is a schematic view of a conventional semiconductor manufacturing apparatus. A semiconductor substrate 2 fixed to a holder 3 is disposed within a generally cylindrical chamber 1. A reactant gas supplied to the interior of the chamber 1 through a gas supply pipe 4a from a gas supply port 4, flows within the chamber 1 in the directions indicated by arrows 6, and then reaches the surface of the substrate 2. The reactant gas which has not been used for reaction is discharged to the outside of the chamber 1 from a discharge port 5. A valve for controlling the amount of exhaust, e.g., an exhaust automatic adjusting valve 7, is provided in an exhaust pipe 7a connected to the discharge port 5.

The thus-arranged conventional semiconductor manufacturing apparatus will be operated in the manner described below. First, the substrate 2 is set on the holder 3 within the chamber 1. Next, after the interior of the chamber 1 has been filled with an inactive gas such as $N_2$, a reactant gas is supplied into the chamber 2 from the gas supply port 4 at a predetermined flow rate. A mixture of HF gas and $N_2$ gas may be used as a reactant gas. If the process is etching, the reactant gas is used an etching gas. At this time, the pressure in the chamber 1 is continuously detected by a sensor (not shown) so that the interior of the chamber 1 can be maintained at a predetermined pressure by the exhaust automatic adjusting valve 7. After the passage of a predetermined time, a substituting gas, e.g., $N_2$ gas or air, is supplied from the gas supply port 4 to substitute for the reactant gas remaining in the chamber 1. The reaction of the reactant gas that takes place on the surface of the substrate 2 starts immediately after the supply of the reactant gas into the chamber 1, and continues until the discharge thereof by the supply of the substituting gas. The substrate 2 is taken out of the chamber 1 after the reactant gas has been completely discharged out of the chamber 1.

In the thus-arranged semiconductor manufacturing apparatus, since the chamber 1 is provided with only one gas supply port for supplying the reactant gas and the substituting gas as well as only one discharge port 5 for discharging the gases, the reactant gas may flow within the chamber 1 at a non-uniform flow rate or in non-uniform directions, depending on the overall shape of the chamber 1, the mounting positions of the gas supply port 4 and the exhaust port 5 and so on. This non-uniformity of the flow rate and the direction of the reactant gas varies the amount of reactant gas that reaches the surface of the substrate 2, making highly accurate processing of the surface of the substrate 2 impossible.

SUMMARY OF THE INVENTION

In view of the aforementioned problem of the related art, an object of the present invention is to provide a semiconductor manufacturing apparatus for uniformly supplying a reactant gas onto the surface of a substrate to ensure that the surface of the substrate is processed with a high degree of accuracy.

To this end, the present invention provides a semiconductor manufacturing apparatus which comprises: a chamber; means for supporting a semiconductor substrate disposed within the chamber; gas supply means disposed in the chamber opposed to the substrate for uniformly supplying gas into the chamber; a first rectifying means disposed between the gas supply means and the substrate for dividing the interior of the chamber, the first rectifying means making the flow rate and the direction of the gas supplied from the gas supply means constant; a discharge means disposed on the opposite side of the substrate from the first rectifying means for uniformly discharging the gas from the interior of the chamber; and second rectifying means disposed between the gas discharge means and the substrate for dividing the interior of the chamber to make the flow rate and the flow direction of the reactant gas constant.

DESCRIPTION OF THE PREFERRED EMBODIMENT

Figure 1:
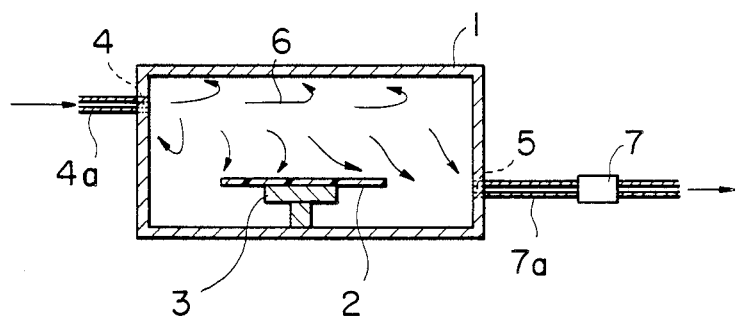
FIG. 1 is a schematic view of a conventional semiconductor manufacturing apparatus.
Figure 2:
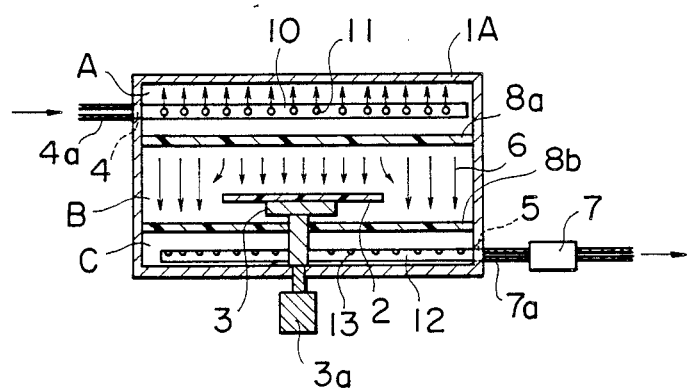
FIG. 2 is a schematic view of an embodiment of a semiconductor manufacturing apparatus according to the present invention.
Figure 3:
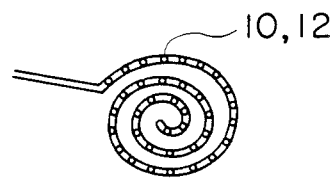
FIG. 3 is a plan view of a gas supply nozzle and a gas discharge nozzle which are employed in the apparatus of FIG. 2.

In FIG. 2 is a schematic view of an embodiment of the present invention. In FIG. 2, the same reference numerals are used to denote parts which are the same as or which correspond to those of the apparatus shown in FIG. 1. A semiconductor substrate 2 supported by a holder 3 is disposed in the lower portion of the interior of a chamber 1A having, for example, a cylindrical form. The upper portion of the chamber 1A is provided with a gas supply port 4 through which a gas including a reactant gas (which may be HF gas or $N_2$ gas, as an etching gas) and a substituting gas is supplied into the chamber 1A from a gas supply pipe 4a. To this gas supply port 4 is connected a gas supply means, e.g., a gas supply nozzle 10, for uniformly supplying the gas into the chamber 1A. The gas supply nozzle 10 has a plurality of gas venting holes 11 at the top or upper portion thereof and which extend over a length larger than the width of the substrate 2. The gas venting holes 11 are holes having a diameter from 100 μm to 10 mm which are formed to uniformly vent the gas into the chamber 1A. Since the substrate 2 has a disk-like form, it is preferable that the gas supply nozzle 10 have a spiral form such as that shown in FIG. 3. The gas is injected toward the ceiling of the chamber 1A from the gas venting holes 11 of the gas supply nozzle 10. A filter 8a, as a first rectifying means, is disposed between the gas supply nozzle 10 and the substrate 2 for dividing the interior of the chamber 1A. The filter 8a is made of an anti-corrosive material such as Teflon. Further, a filter 8b, as a second rectifying means, is disposed on the opposite side of the substrate 2 from the filter 8a for dividing the interior of the chamber 1A. The chamber 1A includes a gas supply portion A, a substrate-processing portion B, and a gas discharge portion C, all defined by the filters 8a and 8b. Below the filter 8b is disposed a discharge means, e.g., a discharge nozzle 12, connected to a discharge port 5. Preferably, the discharge nozzle 12 has the same configuration as that of the gas supply nozzle 10. That is, the discharge nozzle 12 has a plurality of upwardly directed discharge holes 13. The discharge holes 13 have preferably the same diameter as that of the gas venting holes 11.

In the semiconductor manufacturing apparatus arranged in the above-described manner, first, the substrate 2 is set on the holder 3 in the chamber 1A, and the interior of the chamber 1A is then filled with an inactive gas such as $N_2$ gas. Thereafter, the reactant gas is supplied into the chamber 1A from the gas supply port 4. Normally, the reactant gas is supplied at room temperature. The reactant gas which is supplied is vented into the chamber 1A substantially uniformly from the plurality of gas venting holes 11 which are directed upward. The reactant gas strikes the ceiling of the chamber 1A, thereby losing its uniformity of direction. Since a static pressure generated by the reactant gas is applied to the portion of the interior of the chamber 1A disposed above the filter 8a, the reactant gas flows downward through the filter 8a owing to the pressure difference between the chamber 1A and portion B. This allows the reactant gas to be supplied onto the surface of the substrate 2 in a uniform direction at a uniform flow rate. It is preferable for the pores formed in the filter 8a to have a size ranging from 0.01 $\mu$m to 100 $\mu$m. Since the filters 8a and 8b also remove dust from the reactant gas, the smaller the size of the pores, the better. However, excessively small pores increase the pressure loss of the reactant gas that passes through the pores, so the size of the pores should not be less than 0.01 $\mu$m. Further, the size of the pores should not exceed 100 $\mu$m, because pores having a size larger than 100 $\mu$m do not ensure a gas flow which is uniform flow rate and direction. More preferably, the size of the pores range between 0.05 $\mu$m and 10 $\mu$m.

The reactant gas that does not reach the surface of the substrate 2 passes through the filter 8b, and is then discharged outside of the chamber 1A through the discharge nozzle 12 connected to the discharge port 5. The filters 8a and 8b in combination make the flow rate and the direction of the gas flow more uniform. The size of the pores formed in the first and second filters 8a and 8b is preferably the same. However, the pores may vary within the above-described range.

The above-described embodiment employs the spiral gas supply nozzle 10 and the spiral gas discharge nozzle 12. However, a gas supply nozzle 10 and a gas discharge nozzle 12 having other forms may also be used. Further, the plurality of gas venting holes 11 and the plurality of discharge holes 13 are respectively formed in the top of the gas supply nozzle 10 and the discharge nozzle 12. However, they may also be formed in the side or bottom of the gas supply nozzle 10 and the discharge nozzle 12. Furthermore, the substrate 2 may be rotated by a driving means 3a shown in FIG. 2 for processing the surface of the substrate 2 more uniformly. The pores formed in the end portions of the filters 8a and 8b may be closed. The filters 8a and 8b should have pores over at least an area thereof which is larger than that of the substrate 2.

In the above-described embodiment, the gas supply nozzle 10 is disposed in the upper portion of the interior of the chamber 1A, while the discharge nozzle 12 is disposed in the lower portion thereof. However, the gas supply nozzle 10 may be disposed in the lower portion of the interior of the chamber 1A, while the discharge nozzle 12 may be disposed in the upper portion thereof.

What is claimed is:

1. A semiconductor manufacturing apparatus comprising:
   a chamber;
   means for supporting a semiconductor substrate within said chamber;
   gas supply means disposed in said chamber opposite a substrate supported by said means for supporting for supplying a gas into said chamber;
   first rectifying means disposed between said gas supply means and the substrate dividing said chamber for making the flow rate and the direction of the gas supplied to the substrate from said gas supply means constant;
   discharge means disposed on the opposite side of the substrate from said first rectifying means for discharging the gas from said chamber; and
   second rectifying means disposed between said gas discharge means and the substrate dividing said chamber for making the flow rate and the direction of the gas flow away from the substrate constant wherein at least one of said first and second rectifying means comprises a polymeric filter having pores ranging in size from 0.01 $\mu$m to 100 $\mu$m.

2. The semiconductor manufacturing apparatus according to claim 1 wherein said gas supply means includes a gas supply tube containing a plurality of gas venting holes along the tube.

3. The semiconductor manufacturing apparatus according to claim 2 wherein said gas supply tube has a spiral form.

4. The semiconductor manufacturing apparatus according to claim 2 wherein said gas venting holes are formed in the said gas supply tube facing away from the substrate.

5. The semiconductor manufacturing apparatus according to claim 2 wherein said gas venting holes have a diameter ranging from 100 $\mu$m to 10 mm.

6. The semiconductor manufacturing apparatus according to claim 1 wherein said gas discharge means includes a discharge tube containing a plurality of discharge holes.

7. The semiconductor manufacturing apparatus according to claim 6 wherein said discharge tube has a spiral form.

8. The semiconductor manufacturing apparatus according to claim 6 wherein said discharge holes are formed in said discharge tube facing the substrate.

9. The semiconductor manufacturing apparatus according to claim 6 wherein said discharge holes have a diameter ranging from 100 $\mu$m to 10 mm.

10. The semiconductor manufacturing apparatus according to claim 1 wherein said filter has pores having a size ranging from 0.05 $\mu$m to 10 mm.

11. The semiconductor manufacturing apparatus according to claim 1 including driving means for rotating the substrate.

12. The semiconductor manufacturing apparatus according to claim 1 wherein said gas supply means is disposed in a first portion of said chamber wherein said gas discharge means is disposed in a second portion of said chamber and wherein said means for supporting said semiconductor substrate is disposed in said chamber between said first and second portions.

13. A semiconductor manufacturing apparatus comprising:
   a chamber;
   means for supporting a semiconductor substrate within said chamber;
   gas supply means disposed in said chamber opposite a substrate supported by said means for supporting for supplying a gas into said chamber;
   first rectifying means disposed between said gas supply means and the substrate dividing said chamber for making the flow rate and the direction of the gas supplied to the substrate from said gas supply means constant;
   discharge means disposed on the opposite side of the substrate from said first rectifying means for discharging the gas from said chamber; and
   second rectifying means disposed between said gas discharge means and the substrate dividing said chamber for making the flow rate and the direction of the gas flow away from the substrate constant wherein at least one of said gas supply means and said discharge means includes a spiral tube containing a plurality of holes along the tube for the passage of a gas.

14. The semiconductor manufacturing apparatus according to claim 13 wherein said holes are disposed facing away from the substrate.

15. The semiconductor manufacturing apparatus according to claim 13 wherein said holes are disposed facing the substrate.

16. The semiconductor manufacturing apparatus according to claim 13 wherein said holes have a diameter ranging from 100 µm to 10 mm.

17. The semiconductor manufacturing apparatus according to claim 13 wherein at least one of said first and second rectifying means is a polymeric filter.

18. The semiconductor manufacturing apparatus according to claim 17 wherein said filter has pores having a size ranging from 0.01 µm to 100 µm.

19. The semiconductor manufacturing apparatus according to claim 17 wherein said filter has pores having a size ranging from 0.05 µm to 10 µm.

* * * * *